(12) United States Patent
Tanaka et al.

(10) Patent No.: US 8,997,646 B2
(45) Date of Patent: Apr. 7, 2015

(54) ELECTRODE FORMATION SYSTEM FOR SOLAR CELL AND ELECTRODE FORMATION METHOD FOR SOLAR CELL

(75) Inventors: Tetsuya Tanaka, Yamanashi (JP); Yuji Otake, Yamanashi (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 189 days.

(21) Appl. No.: 13/582,881

(22) PCT Filed: Mar. 18, 2011

(86) PCT No.: PCT/JP2011/001654
§ 371 (c)(1),
(2), (4) Date: Sep. 5, 2012

(87) PCT Pub. No.: WO2011/118195
PCT Pub. Date: Sep. 29, 2011

(65) Prior Publication Data
US 2012/0329205 A1    Dec. 27, 2012

(30) Foreign Application Priority Data

Mar. 24, 2010 (JP) ................................. 2010-068256

(51) Int. Cl.
*B05C 17/04* (2006.01)
*B41M 1/12* (2006.01)
(Continued)

(52) U.S. Cl.
CPC ............ *H01L 31/18* (2013.01); *B41F 15/0881* (2013.01); *H01L 31/022425* (2013.01); *Y02E 10/50* (2013.01)

(58) Field of Classification Search
USPC .................................. 101/123, 126, 127, 129
See application file for complete search history.

(56) References Cited

U.S. PATENT DOCUMENTS 6,591,745 B2 *   7/2003   Miyahara et al. ............. 101/123
6,698,347 B2 *   3/2004   Miyahara et al. ............. 101/123
(Continued)

FOREIGN PATENT DOCUMENTS

CN    2032942 U    2/1989
CN    1407634 A    4/2003
(Continued)

OTHER PUBLICATIONS

Chinese Office action for Application No. 201180012710.0 dated Jul. 24, 2014.
(Continued)

*Primary Examiner* — Ren Yan
*Assistant Examiner* — Marissa Ferguson Samreth
(74) *Attorney, Agent, or Firm* — Pearne & Gordon LLP (57) ABSTRACT

An electrode formation method for a solar cell to form an electrode of a base member, includes a screen printing process and a baking process. The screen printing process includes: mounting a metal mask on a surface of the base member, wherein the metal mask includes a covering portion configured to cover a part of a surface of the base member, opening portions configured to allow parts of the base member to be exposed therefrom, and bridge portions disposed along a direction intersecting with a longitudinal direction of circuit patterns between the opening portions; and supplying a paste to an upper surface of the metal mask by a squeegee head of a cartridge type, while relatively sliding a squeegee on the upper surface of the metal mask such that the squeegee travels relatively to the metal mask. In the baking process, the paste is baked to form the electrode.

7 Claims, 12 Drawing Sheets

(51) Int. Cl.
*H01L 31/18* (2006.01)
*B41F 15/08* (2006.01)
*H01L 31/0224* (2006.01)

(56) References Cited

U.S. PATENT DOCUMENTS

| | | | |
|---|---|---|---|
| 6,962,111 B2 * | 11/2005 | Tanaka et al. | 101/127 |
| 7,630,536 B2 * | 12/2009 | Fukagawa et al. | 382/151 |
| 2003/0041893 A1 | 3/2003 | Shimakawa et al. | |
| 2006/0124003 A1 * | 6/2006 | Sakaida et al. | 101/123 |
| 2009/0025581 A1 * | 1/2009 | Cho et al. | 101/127 |

FOREIGN PATENT DOCUMENTS

| | | |
|---|---|---|
| CN | 2696830 Y | 5/2005 |
| JP | 2006-341547 A | 12/2006 |
| JP | 2010-010245 A | 1/2010 |

OTHER PUBLICATIONS

International Search Report for PCT/JP2011/001654 dated Jun. 21, 2011.

* cited by examiner

ELECTRODE FORMATION SYSTEM FOR SOLAR CELL AND ELECTRODE FORMATION METHOD FOR SOLAR CELL

TECHNICAL FIELD

The present invention relates to an electrode formation system for a solar cell, and an electrode formation method for the solar cell, in which paste such as cream soldering or conductive paste is printed on a base member.

BACKGROUND ART

Up to now, there have been known an electrode formation system for a solar cell, and an electrode formation method for the solar cell, in which, in printing for forming electrodes, a first conductive paste is coated on a substrate to bake a first layer electrode, and a second conductive paste is coated on the first layer electrode to bake a second layer electrode (for example, refer to Patent Document 1).

RELATED ART DOCUMENTS

Patent Documents

Patent Document 1: JP-A-2010-10245 (FIG. 1, claim 1)

SUMMARY OF THE INVENTION

Problem to be Solved by the Invention

In order to improve a conversion efficiency of the solar cell, it is desirable to form thickened electrodes.

In order to meet the need, in the electrode formation system for the solar batter and the electrode formation method for the solar battery disclosed in the above Patent Document 1, each of the printing and baking processes is conducted twice for the purpose of forming the thickened electrodes.

Accordingly, in the electrode formation system for the solar batter and the electrode formation method for the solar battery disclosed in the above Patent document 1, because each of the printing and baking processes is conducted twice is conducted twice, it is difficult to improve the productivity.

The present invention has been made to solve the above-described problem, and an object thereof is to provide an electrode formation system for a solar batter and an electrode formation method for the solar battery, which can improve the productivity.

Means for Solving the Problem

According to the present invention, there is provided an electrode formation system for a solar cell to form an electrode of a base member used for the solar cell, the electrode formation system including: a screen printing process in which, after a metal mask including a covering portion configured to cover a part of a surface of the base member, a plurality of opening portions configured to allow parts of the base member to be exposed therefrom, and bridge portions disposed along a direction intersecting with a longitudinal direction of circuit patterns between the opening portions is mounted on the surface of the base member, a paste for forming the electrode is supplied to an upper surface of the metal mask under a given pressure by a squeegee head of a cartridge type while a squeegee having a given length is relatively slid on the upper surface of the metal mask; and a baking process in which the paste put on the surface of the base member in a given configuration is baked to form the paste as the electrode, wherein in the screen printing process, the squeegee travels relatively to the metal mask along an alignment direction of the opening portions and the bridge portions.

According to the present invention, in the screen printing process, the squeegee travels relatively to the metal mask. Then, in the baking process, the paste on the upper surface of is baked.

Accordingly, in the present invention, the thick electrode is formed through one screen printing process and one baking process, whereby the productivity can be improved.

According to the present invention, in the above-described electrode formation system for the solar cell, the squeegee head is disposed relatively to the metal mask such that a longitudinal direction of the squeegee extends along a direction orthogonal to an alignment direction of the opening portions and the bridge portions, and the squeegee travels relatively to the metal mask along the alignment direction of the opening portions and the bridge portions.

In the present invention, because the paste can be efficiently supplied to the opening portions and the bridge portions in the metal mask, the electrode of the solar cell can be surely formed in a desired configuration.

According to the present invention, in the above-described electrode formation system for the solar cell, the electrode is formed by conducting the screen printing process and the baking process once.

In the present invention, since each of the printing process and the baking process is conducted only once, the man-hour can be remarkably reduced.

According to the present invention, in the above electrode formation system for the solar cell, the aspect ratio for a cross-sectional shaped of the electrode is 1.0 or higher.

In the present invention, the aspect ratio can be dramatically improved whereas the aspect ratio for the mesh mask used up to now is 0.7 or lower.

According to the present invention, there is provided an electrode formation method for a solar cell to form an electrode of a base member used for the solar cell, the electrode formation method including: a screen printing process in which, when supplying a paste for forming the electrode to an upper surface of a metal mask under a given pressure by a squeegee head of a cartridge type while a squeegee having a given length is relatively slid on the upper surface of the metal mask after the metal mask including a covering portion configured to cover a part of a surface of the base member, a plurality of opening portions configured to allow parts of the base member to be exposed therefrom, and bridge portions disposed along a direction intersecting with a longitudinal direction of circuit patterns between the opening portions is mounted on the surface of the base member, the squeegee travels relatively to the metal mask is conducted; and a baking process in which the paste put on the surface of the base member in a given configuration is baked to form the paste as the electrode is conducted, after the screen printing process.

In the present invention, the thick electrode is formed through one screen printing process and one baking process with the result that the productivity can be improved.

According to the present invention, in the above-described electrode formation method for the solar cell, after the squeegee is disposed relatively to the metal mask such that a longitudinal direction of the squeegee extends along a direction orthogonal to an alignment direction of the opening portions and the bridge portions, the squeegee travels relatively to the metal mask along the alignment direction of the opening portions and the bridge portions.

According to the present invention, in the above-described electrode formation method for the solar cell, the electrode is formed by conducting the screen printing process and the baking process once.

Advantages of the Invention

According to the electrode formation system for the solar cell and the electrode formation method for the solar cell according to the present invention, in the screen printing process, the squeegee, which is arranged relatively to the metal mask such that the longitudinal direction thereof extends along the direction orthogonal to the alignment direction of the opening portions and the bridge portions of the metal mask, travels relatively to the metal mask along the alignment direction of the opening portions and the bridge portions in the metal mask. Then, in the baking process, the paste on the surface of the base member is baked.

As a result, according to the electrode formation system for the solar cell and the electrode formation method for the solar cell according to the present invention, the thick electrode is formed through one screen printing process and one baking process with the advantage that the productivity can be improved.

BRIEF DESCRIPTION OF THE DRAWINGS

FIG. 8 is a cross-sectional view taken along a line B-B of FIG. 7.

MODE FOR CARRYING OUT THE INVENTION

Hereinafter, a description will be given of a screen printing device and a screen printing method according to an embodiment of the present invention with reference to the drawings.

A screen printing device 10 employing a screen printing method according to an embodiment of the present invention includes a base member 11, a support 12 that supports the base member 11, a metal mask 1, a squeegee head 13 that supplies a paste P that forms a circuit pattern to a surface of the metal mask 1 while relatively sliding a squeegee having a given length on an upper surface of the metal mask 1, and a cleaning mechanism 15 that cleans a lower surface of the metal mask 1.

As illustrated in FIGS. 1, 2, 3, and 4, in the screen printing device 10, the support 12 that is a positioning unit for the base member 11 is configured by stacking a Y-axial table 16, an X-axial table 17, and a θ-axial table 18 over each other. Further, a first Z-axial table 19 and a second Z-axial table 20 are disposed in combination over those components.

The first Z-axial table 19 includes a horizontal base plate 21, and the base member 11 is transported while both ends of the base member 11 are supported by two transport rails 23 disposed in parallel to a base member transport direction (X-direction) in a base member transport unit 22 over the base plate 21. The base member transport unit 22 extends toward an upstream side and a downstream side, and the base member 11 brought in from the upstream side is transported by the base member transport unit 22, and also positioned by the support 12. The base member 11 that has been printed is transported to the downstream side by the transport rails 23.

Figure 1:
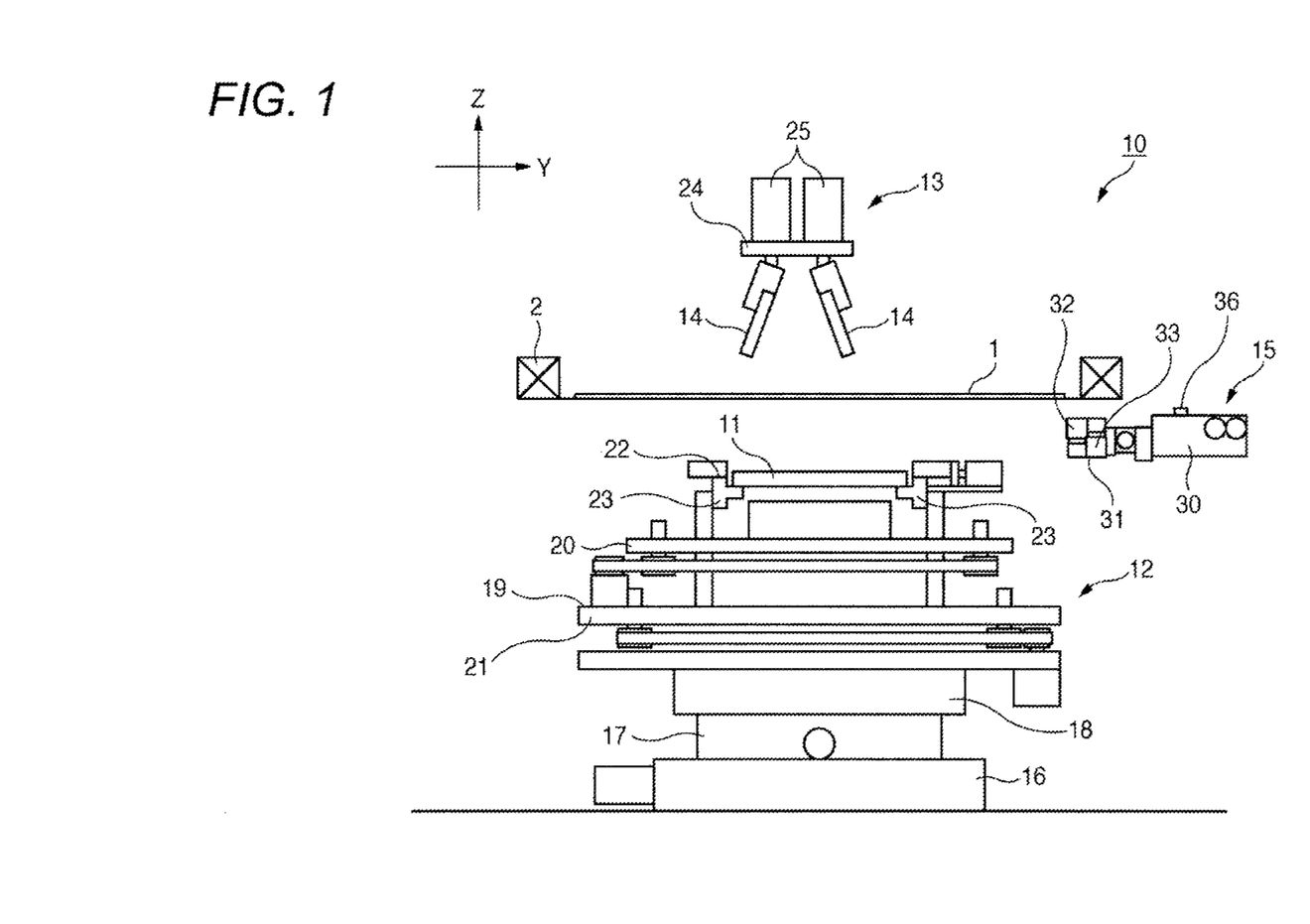
FIG. 1 is a front view of a screen printing device having open squeegees applying a screen printing method according to an embodiment of the present invention.
Figure 10:
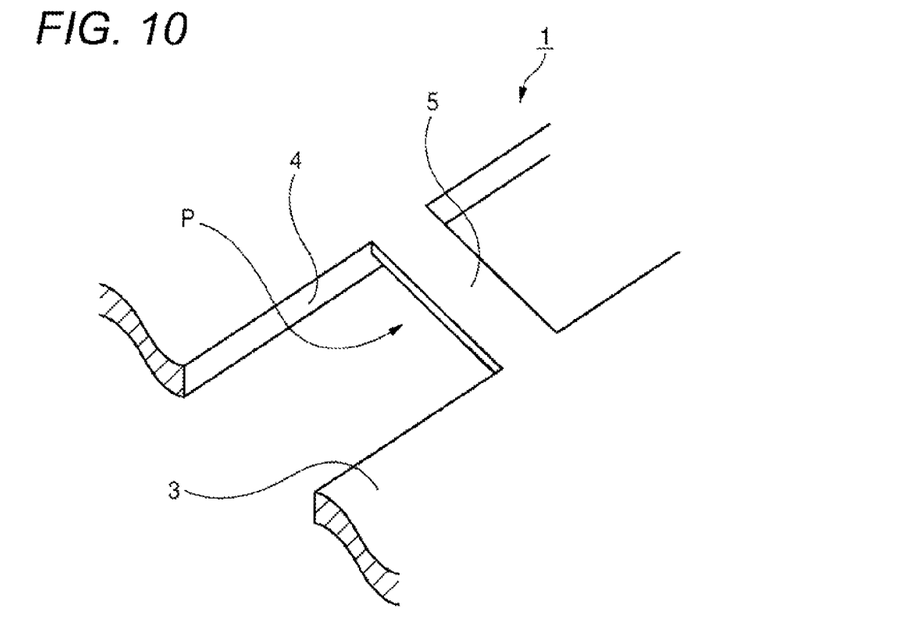
FIG. 10 is a perspective view of an appearance of a periphery of a cross link in the metal mask of FIG. 5.

The metal mask 1 is extended within a mask frame 2. The squeegee head 13 is disposed above the metal mask 1. The squeegee head 13 is of an open type in which squeegee lifting mechanisms 25 for moving up and down squeegees 14 each having a given length are disposed on a horizontal plate 24. The squeegee head 13 supplies the paste P (refer to FIG. 10) that forms a circuit pattern to the surface of the metal mask 1, and with the driving of the squeegee lifting mechanisms 25, the squeegees 14 is moved up and down and abutted against an upper surface of the metal mask 1.

Figure 2:
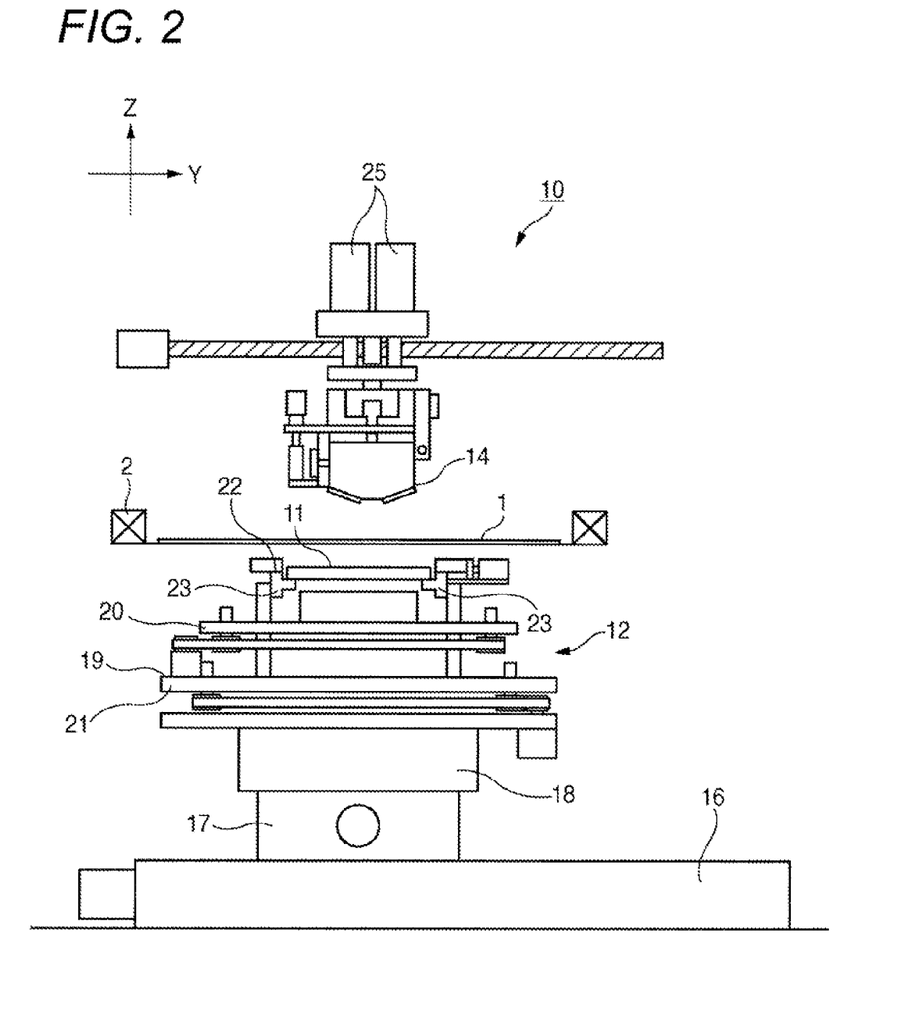
FIG. 2 is a front view of a screen printing device having a cartridge squeegee applying the screen printing method of FIG. 1.
Figure 3:
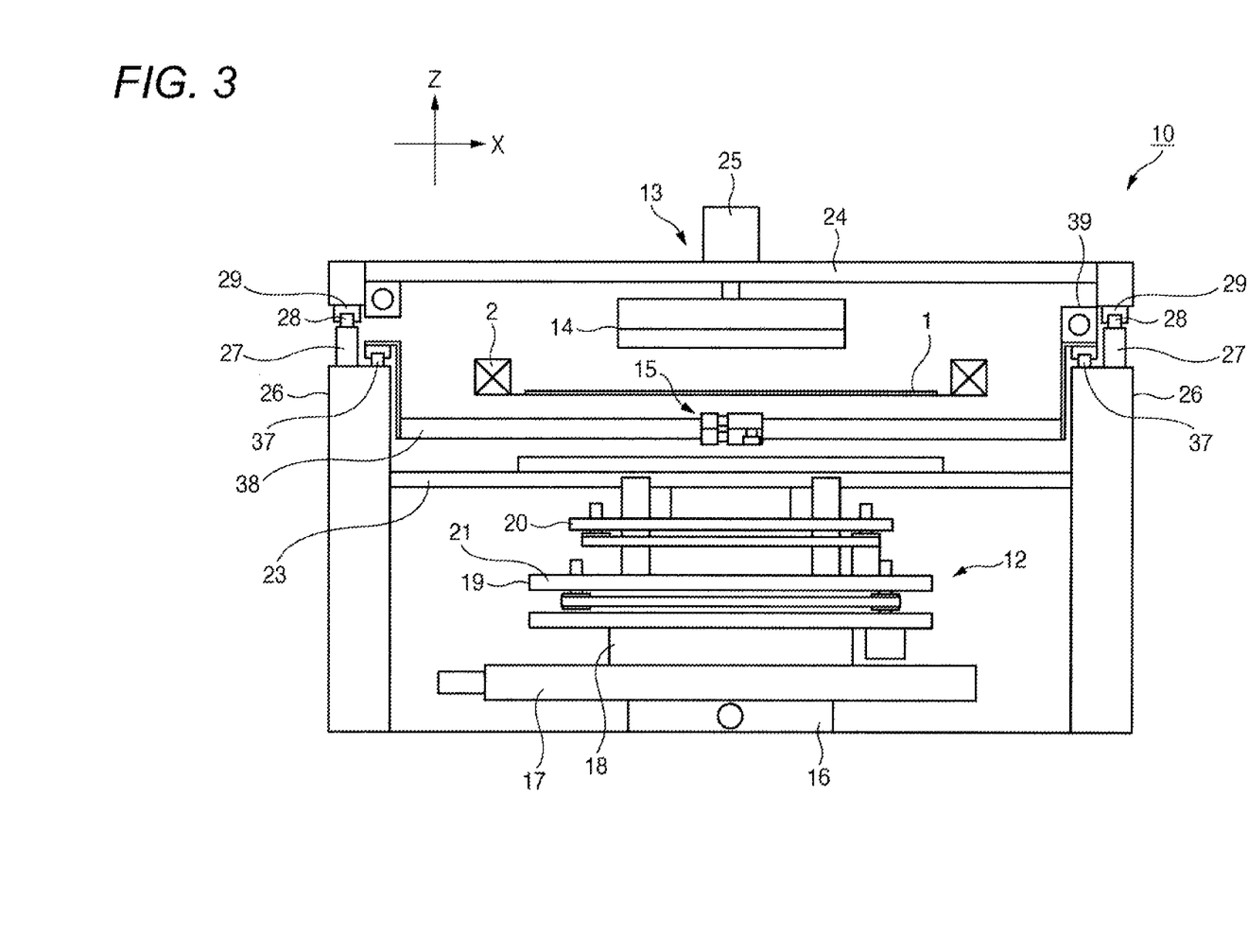
FIG. 3 is a side view of the screen printing device in FIG. 1.
Figure 4:
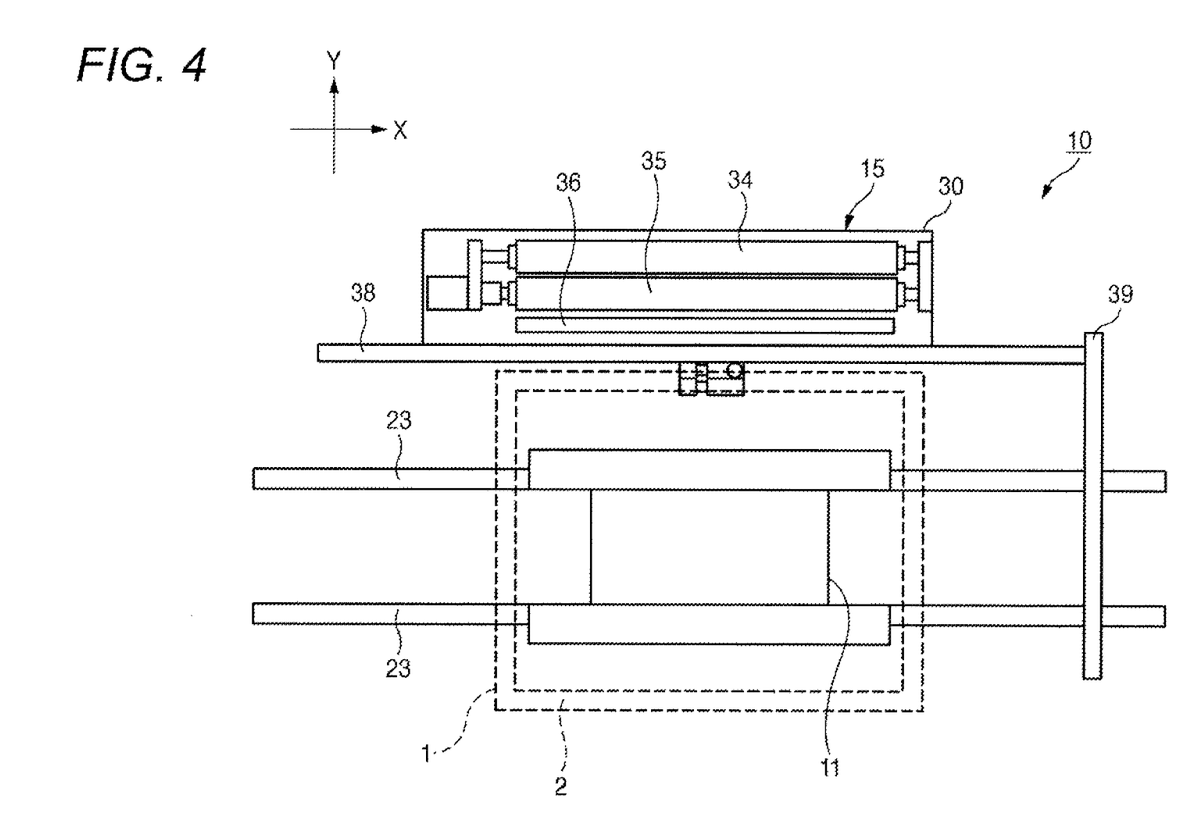
FIG. 4 is a plan view of the screen printing device in FIG. 1.
Figure 5:
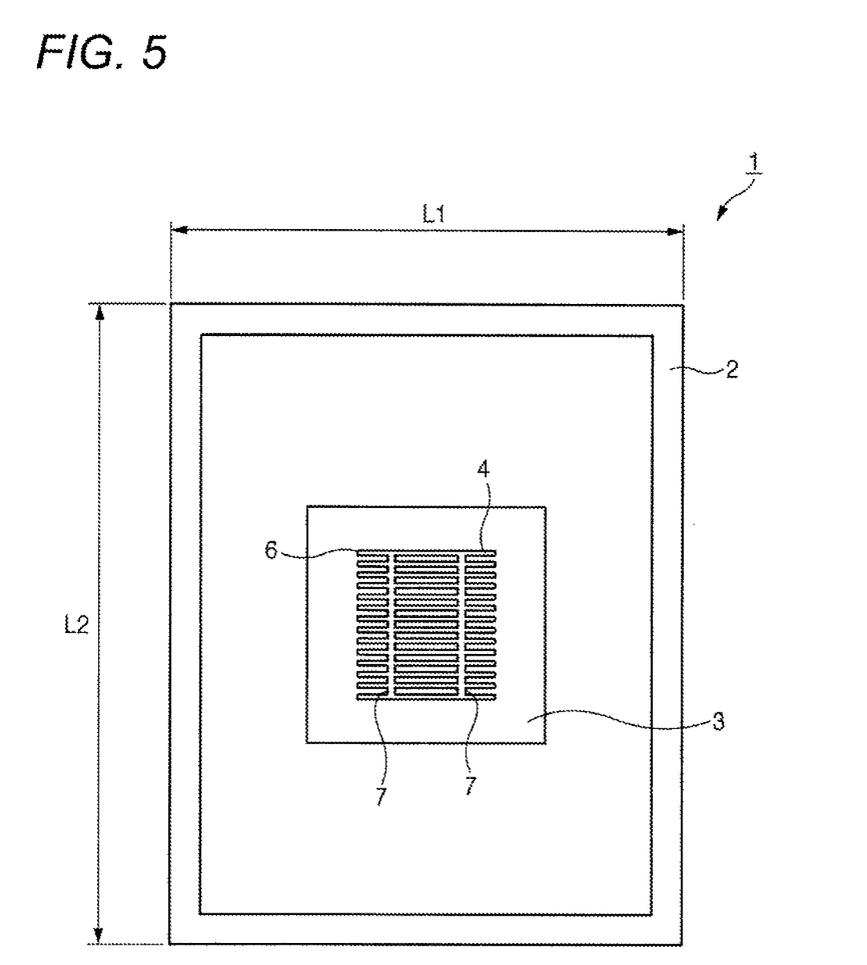
FIG. 5 is a plan view of a metal mask applied to the screen printing device of FIG. 1.
Figure 6:
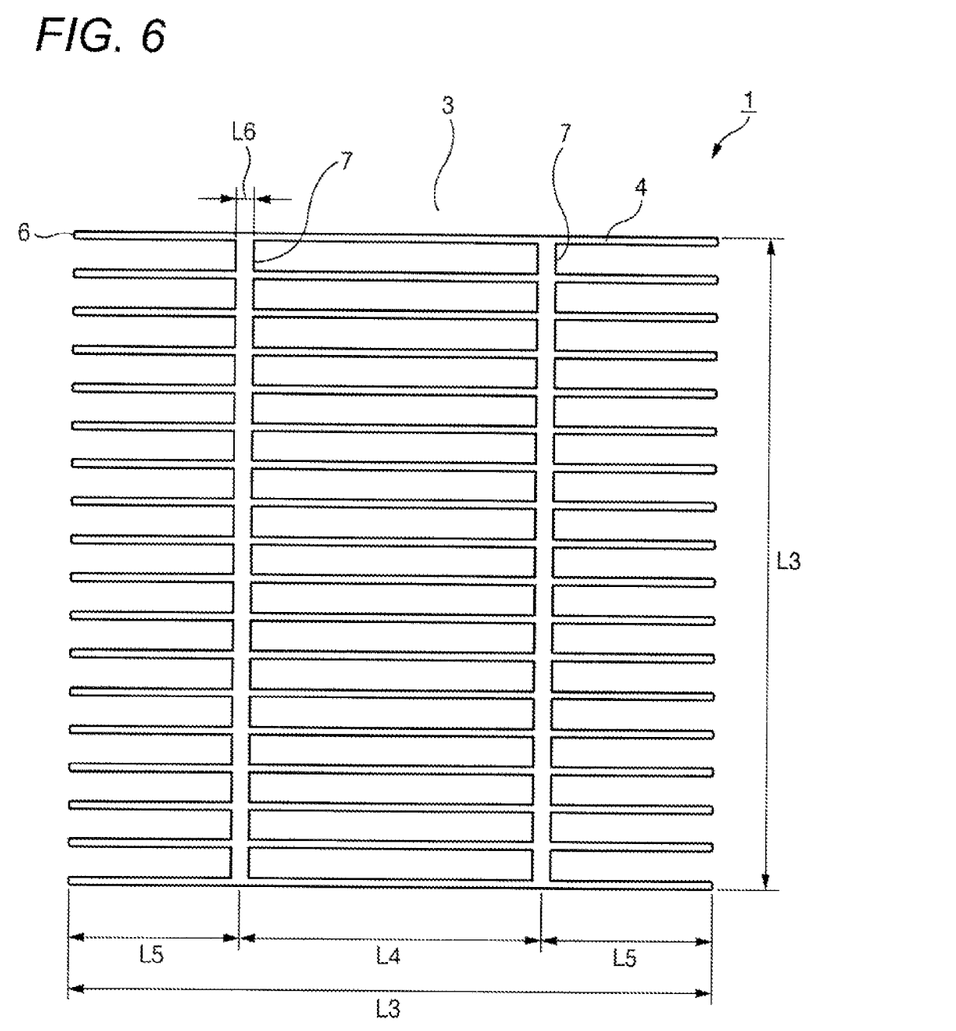
FIG. 6 is an enlarged view of the metal mask of FIG. 5.

FIG. 2 illustrates the screen printing device 10 having the squeegee head 13 of the cartridge type instead of the squeegee head 13 of the open type. Like the above configuration, the screen printing device 10 supplies the paste P (refer to FIG. 10) that forms a circuit pattern to the surface of the metal mask 1, and with the driving of the squeegee lifting mechanisms 25, the squeegees 14 is moved up and down and abutted against the upper surface of the metal mask 1. The squeegee head 13 of the cartridge type is excellent in filling property as compared with that of the open type.

A bracket 27 is disposed on each of vertical frames 26. A guide rail 28 is disposed on each bracket 27 in a Y-direction. Sliders 29 that are each slidably fitted to the guide rail 28 are coupled to both ends of the plate 24. With this configuration, the squeegee head 13 is slidable in the Y-direction.

In the cleaning mechanism 15, a cleaning head unit 30 travels integrally with a camera head unit 31 that images the base member 11 and the metal mask 1. The camera head unit 31 includes a base member recognition camera 32 for imaging the base member 11 from above, and a mask recognition camera 33 for imaging the metal mask 1 from a lower surface side thereof. With the travel of the camera head unit 30, the recognition of the base member 11 and the recognition of the metal mask 1 can be conducted at the same time.

In the cleaning head unit 30 are disposed a paper roll 34 on which an unused cleaning paper is winded, a paper roll 35 on which a used cleaning paper is winded, and a cleaning nozzle 36 that sets a cleaning area having a given length for a lower surface of the metal mask 1. The cleaning head unit 30 is supported by a head X-axil table 38 that is slidably assembled with guide rails 37 disposed on the vertical frames 26, and horizontally travels by a head Y-axial travel mechanism 39 on the head X-axil table 38.

The cleaning head unit 30 is retreated to a side of the support 12 during waiting. In the execution of cleaning, the cleaning head unit 30 is advanced to a lower side of the metal mask 1 together with the camera head unit 31, and the cleaning head unit 30 then moves up. Then, the cleaning head unit 30 is allowed to travel horizontally to execute cleaning in a state where the cleaning paper is pushed against the lower surface of the metal mask 1 by the cleaning nozzle 36.

Subsequently, the metal mask 1 will be described in detail. As illustrated in FIGS. 5, 6, 7, 8, 9, and 10, the metal mask 1 has, for example, a thickness dimension T1 of 0.1 mm, a width dimension L1 of 550 mm, and a length dimension L2 of 650 mm. The metal mask 1 includes, inside the mask frame 2, a covering portion 3 that covers a part of the surface of the base member 11, and a plurality of rectangular opening portions 4 from which parts of the base member 11 are exposed. Bridge portions 5 are disposed along a direction orthogonal to a longitudinal direction of the circuit patterns formed between the respective opening portions 4. The metal mask 1 has a plurality of grid portions 6 arrayed in parallel, in which the opening portions 5 and the bridge portions 5 are disposed, and has a band-like bus bar portions 7 continuous to termination opening portions at ends of the respective grid portions 6 in a longitudinal direction thereof.

The grid portions 6 each have a line width dimension of, for example, 0.08 mm, and are 67 in number. In the grid portions 6 are arranged the bus bar portion 7 having width dimensions L6 of 2 mm at the respective positions of a length dimension L5 of 39 mm from right and left in FIG. 6 with a width dimension L4 of 75 mm of a center portion interposed therebetween within a width dimension L3 of, for example, 153 mm in the longitudinal direction. The opening portions 4 each have a width dimension L7 of, for example, 0.08 mm. The bridge portions 5 each have a width dimension L8 of, for example, 0.05 mm, and a height dimension L9 of, for example, 0.02 mm. The bridge portions 5 each have a height dimension L9 of, for example, 0.02 mm at an upper end of the opening portion 4 having the thickness dimension T1 of, for example, 0.1 mm, and therefore each lower surface of the bridge portions 5 is formed in a recess step with respect to a lower surface of the covering portion 3.

Figure 11:
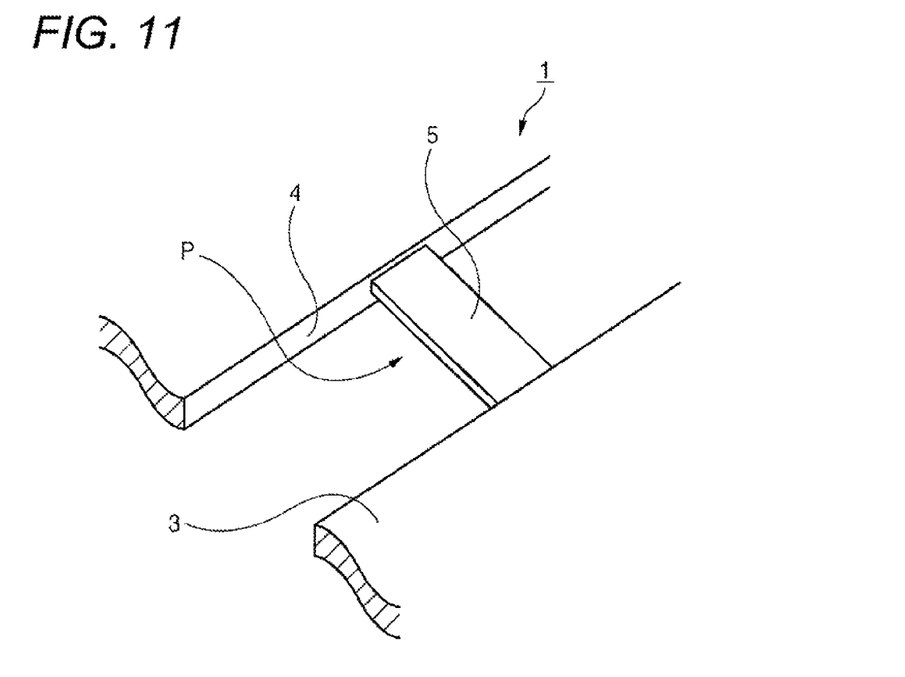
FIG. 11 is a perspective view of an appearance of a periphery of a cross link in a modified example of the metal mask of FIG. 5.

As in a modified example of the metal mask 1 illustrated in FIG. 11, each of the bridge portions 5 may be arranged in the center portion of the rectangular opening portion 4 in the thickness direction. Similarly, in this case, each of the bridge portions 5 has the lower surface formed in a recess step with respect to the lower surface of the covering portion 3.

Subsequently, a description will be given of an electrode formation system for a solar cell employing the screen printing device 10, and an electrode formation method for a solar cell employing the screen printing method. In the electrode formation method for the solar cell, a screen printing process using the squeegee head of the cartridge type, and a baking process are conducted.

In the screen printing process, when the base member 11 is brought into a printing position of the base member 11 by the base member transport unit 22, the second Z-axial table 20 is driven to receive the lower surface of the base member 11. Then, in this state, the base member 11 is positioned with respect to the metal mask 1 by the support 12 to bring the metal mask 1 in surface contact with the base member 11. In this situation, the squeegee head 13 arranges the squeegees 14 relatively to the metal mask 1 so that a longitudinal direction of the squeegees 14 conforms with a direction orthogonal to an alignment direction of the opening portions 4 and the bridge portions 5 of the metal mask 1. Then, while the paste P is supplied to the metal mask 1 under a given pressure by the squeegees 14, the squeegees 14 are slid relatively to the metal mask 1 in the Y-direction along the alignment direction of the opening portions 4 and the bridge portions 5, thereby conducting contact printing in a state where the base member 11 contacts the metal mask 1. In this situation, the paste P is pressed and advanced from the respective opening portions 4 toward lower sides of the bridge portions 5 with the travel of the squeegees 14 in the Y-direction, with the result that the opening portions 4 including the lower sides of the bridge portions 5 are fully filled with the paste P. The base member 11 that has been printed is discharged to a downstream side for a baking process by the transport rails 23.

Figure 7:
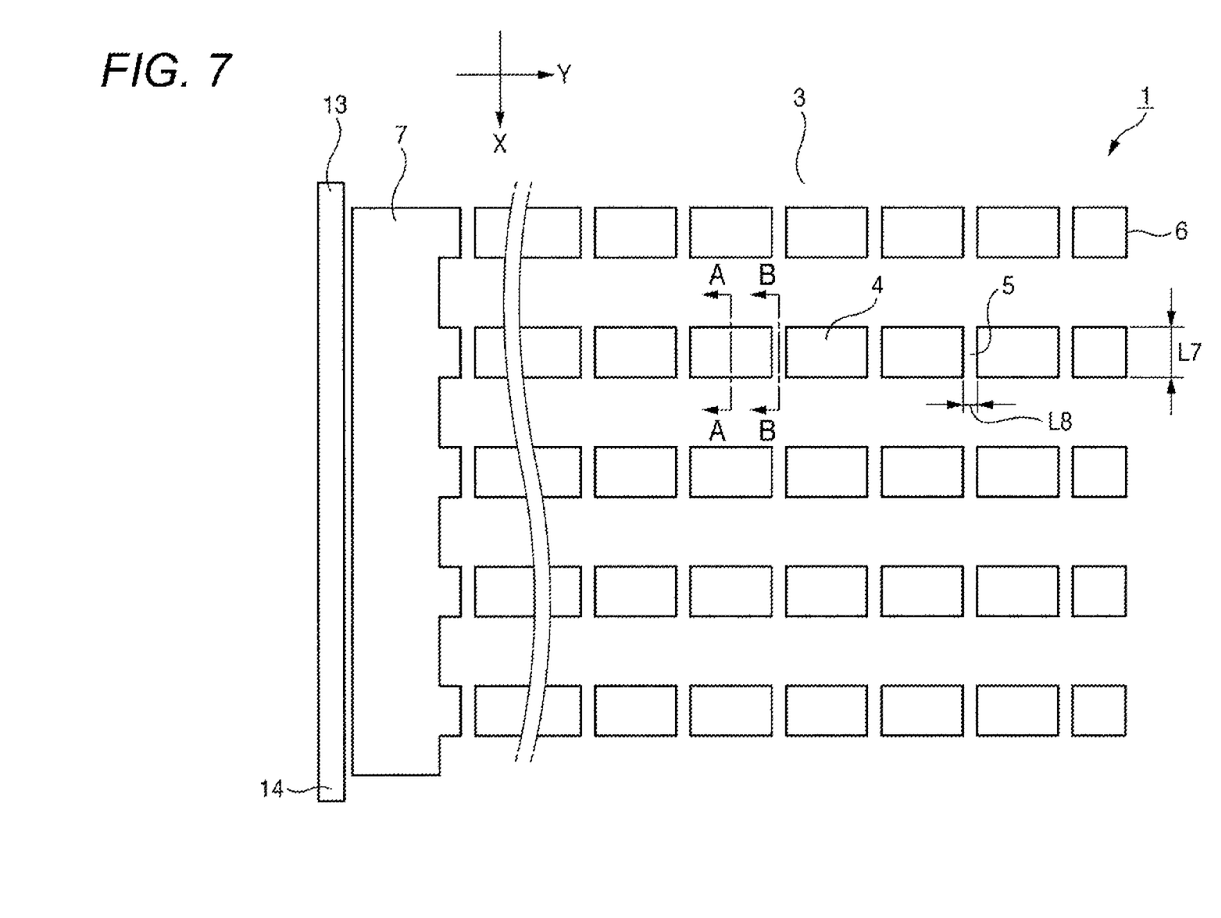
FIG. 7 is an enlarged view of a main portion of the metal mask of FIG. 5.
Figure 8:
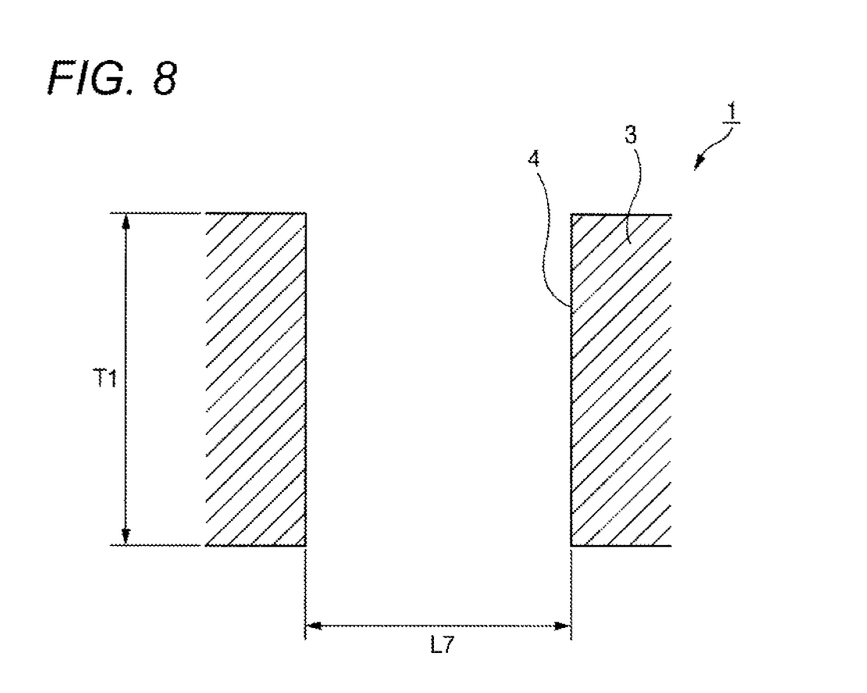
FIG. 8 is a cross-sectional view taken along a line A-A of FIG. 7.
Figure 9:
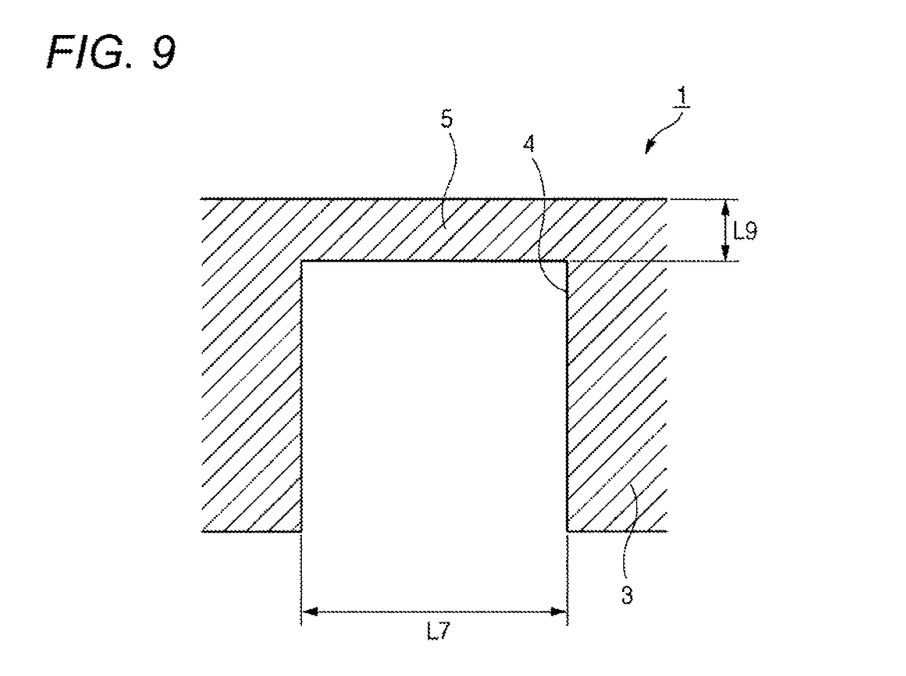

That is, as illustrated in FIG. 7, the squeegee head 13 arranges the squeegees 14 relatively to the metal mask 1 so that a longitudinal direction of the squeegees 14 conforms with a direction orthogonal to an alignment direction of the opening portions 4 and the bridge portions 5 of the metal mask 1. While the paste P is supplied to the metal mask 1 under the given pressure by the squeegees 14, the squeegees 14 are slid relatively to the metal mask 1 in the Y-direction along the alignment direction of the opening portions 4 and the bridge portions 5, thereby conducting contact printing in a state where the base member 11 contacts the metal mask 1.

The paste P is supplied to the surface of the metal mask 1 under the given pressured by the squeegee head 13 of the cartridge type whereby the paste P is pressed and advanced from the respective opening portions 4 toward the lower sides of the bridge portions 5, with the result that the opening portions 4 including the lower sides of the bridge portions 5 are fully filled with the paste P.

Subsequently, in the baking process, baking is executed in a state where the paste P is put on the surface of the base member 11 in a given configuration. As a result, the paste P is formed on an electrode of the solar cell. In this situation, in order to form the electrode, the squeegee head 13 of the cartridge type is used in the screen printing process, with the result that the screening printing process and the baking process are conducted once. Then, with the use of the squeegee head 13 of the cartridge type in the screening printing process, an electrode having a cross-sectional configuration whose aspect ratio is set to 1.0 or more.

When cleaning is conducted in the screen printing device 10 where printing has been completed, a longitudinal direction of the cleaning nozzle 36 in the cleaning head unit 30 is disposed in parallel to a longitudinal direction of the bus bar portion 7 of the metal mask 1, and a lower surface of the metal mask 1 is cleaned.

In this situation, because the longitudinal direction of the cleaning nozzle 36 is disposed in parallel to the longitudinal direction of the metal mask 1, that is, the bus bar portion 7 is wider than the grid portions 6, the amount of a residual paste of the bus bar portion 7 is larger than that of the grid portions 6. For that reason, with the nozzle arrangement that puts cleaning of the bus bar portion 7 ahead of cleaning of the grid portions 6, the cleaning quality can be improved as the overall metal mask 1.

Figure 12:
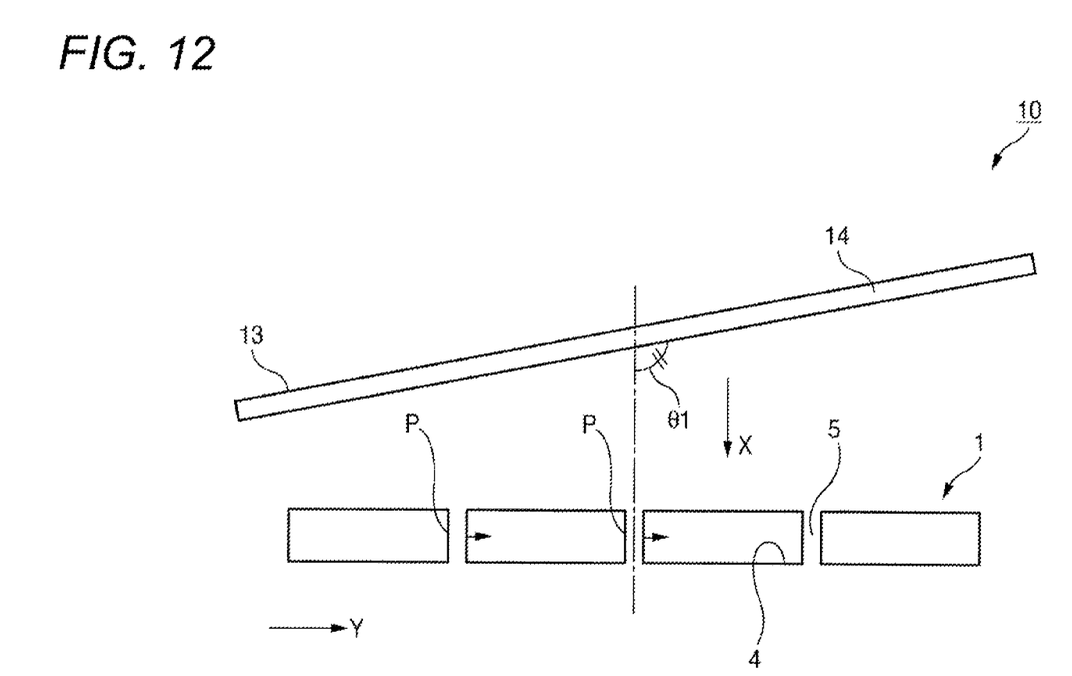
FIG. 12 is a plan view of a main portion of a modified example of the screen printing device of FIG. 1.

As illustrated in FIG. 12, in a modified example of the screen printing device 10, there is used the metal mask 1 in which the bridge portions 5 are disposed along a direction orthogonal to a longitudinal direction of the circuit patterns formed between the respective opening portions 4. The squeegees 14 are disposed relatively to the metal mask 1 so that the longitudinal direction of the squeegees 14 conforms with a direction intersecting with a direction orthogonal to the alignment direction of the opening portions 4 and the bridge portion 5 in the metal mask 1 at a given angle θ1. The squeegees 14 travel relatively along the X-direction orthogonal to the alignment direction of the opening portions 4 and the bridge portions 5 in the metal mask 1. The squeegees 14 travels from the direction intersecting with the direction orthogonal to the alignment direction of the opening portions 4 and the bridge portions 5 in the metal mask 1 at the given angle θ1. As a result, the paste P is obliquely pressed and advanced from the respective opening portions 4 toward the lower sides of the bridge portions 5 whereby the respective opening portions 4 including the lower sides of the bridge portions 5 are sufficiently filled with the paste P.

Figure 13:
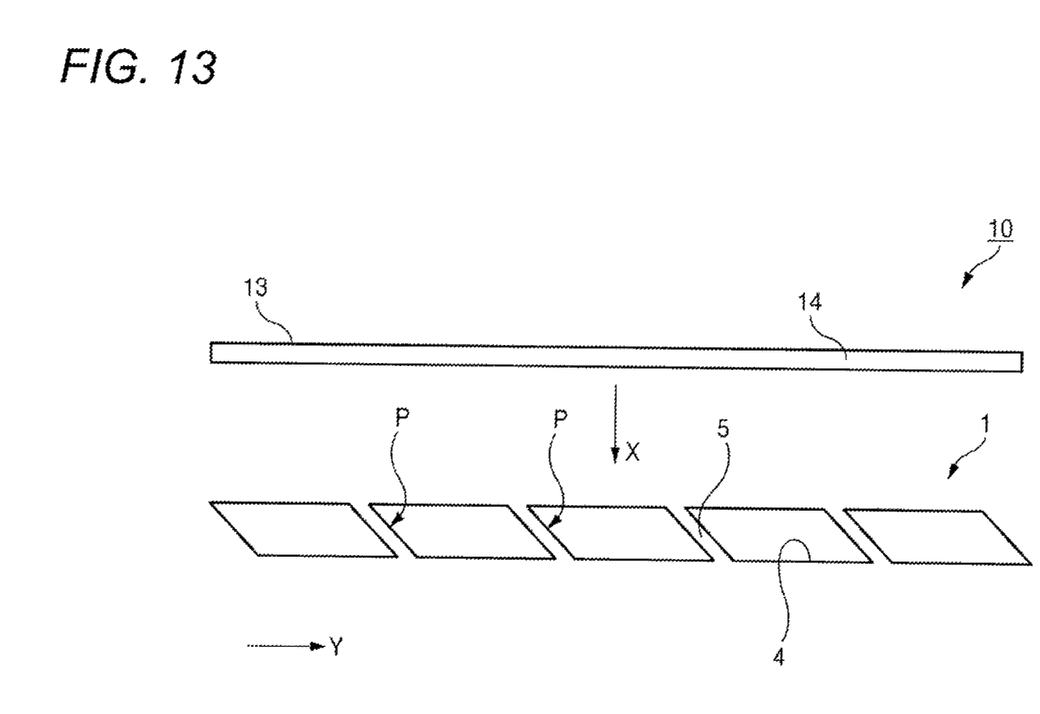
FIG. 13 is a plan view of one modified example of the metal mask of FIG. 5.

As illustrated in FIG. 13, in a modified example of the metal mask 1, the respective opening portions 4 each having a parallelogram are disposed along the longitudinal direction of the formed circuit patterns. For that reason, the bridge portions 5 are disposed obliquely to a direction orthogonal to the longitudinal direction of the formed circuit patterns. In this modified example, the longitudinal direction of the squeegees 14 is disposed relatively in the direction orthogonal to the alignment direction of the opening portions 4 and the bridge portions 5 in the metal mask 1, and the squeegees 14 travel relatively to the metal mask 1 along the X-direction orthogonal to the alignment direction of the opening portions 4 and the bridge portions 5. As a result, the paste P is pressed and advanced from each acute angle portion of the bridge portions 5 disposed obliquely to a traveling direction of the squeegees 14 toward each lower side of the bridge portions 5 with the result that the respective opening portions 4 including the lower sides of the bridge portions 5 are sufficiently filled with the paste P. The squeegees 14 may travel relatively to the metal mask 1 in the Y-direction conforming with the alignment direction of the opening portions 4 and the bridge portions 5.

Figure 14:
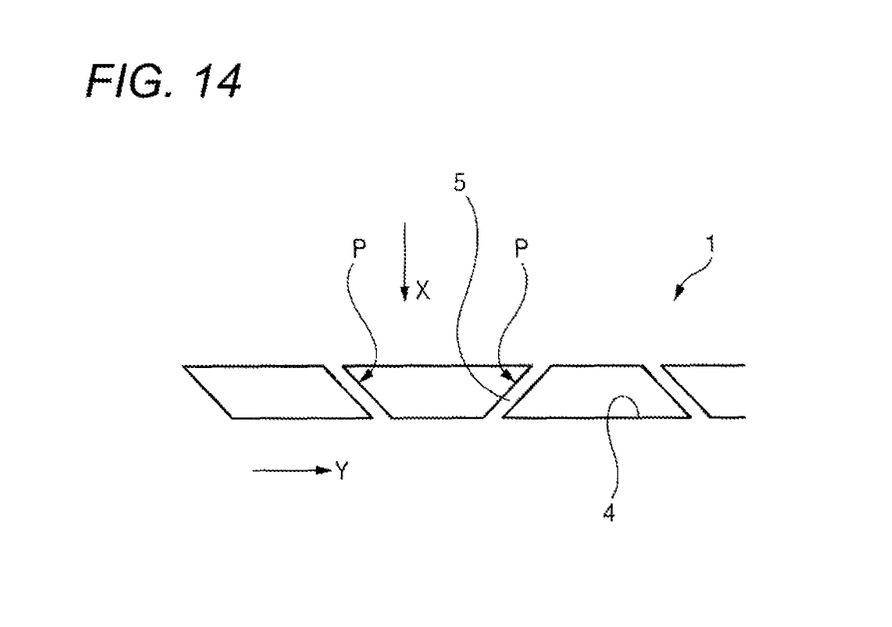
FIG. 14 is a plan view of another modified example of the metal mask of FIG. 5.

As illustrated in FIG. 14, in another modified example of the metal mask 1, the respective opening portions 4 each having an isosceles trapezoid in which an upper base and a lower base are arranged at staggered positions are disposed along the longitudinal direction of the formed circuit patterns. For that reason, the bridge portions 5 are disposed obliquely to a direction orthogonal to the longitudinal direction of the formed circuit patterns. In this modified example, the longitudinal direction of the squeegees 14 is disposed relatively in the direction orthogonal to the alignment direction of the opening portions 4 and the bridge portions 5 in the metal mask 1, and the squeegees 14 travel relatively to the metal mask 1 along the alignment direction of the opening portions 4 and the bridge portions 5. As a result, the paste P is pressed and advanced from each acute angle portion of the bridge portions 5 disposed obliquely to a traveling direction of the squeegees 14 toward each lower side of the bridge portions 5 with the result that the respective opening portions 4 including the lower sides of the bridge portions 5 are sufficiently filled with the paste P. The squeegees 14 may travel relatively to the metal mask 1 in the Y-direction conforming with the alignment direction of the opening portions 4 and the bridge portions 5.

Figure 15:
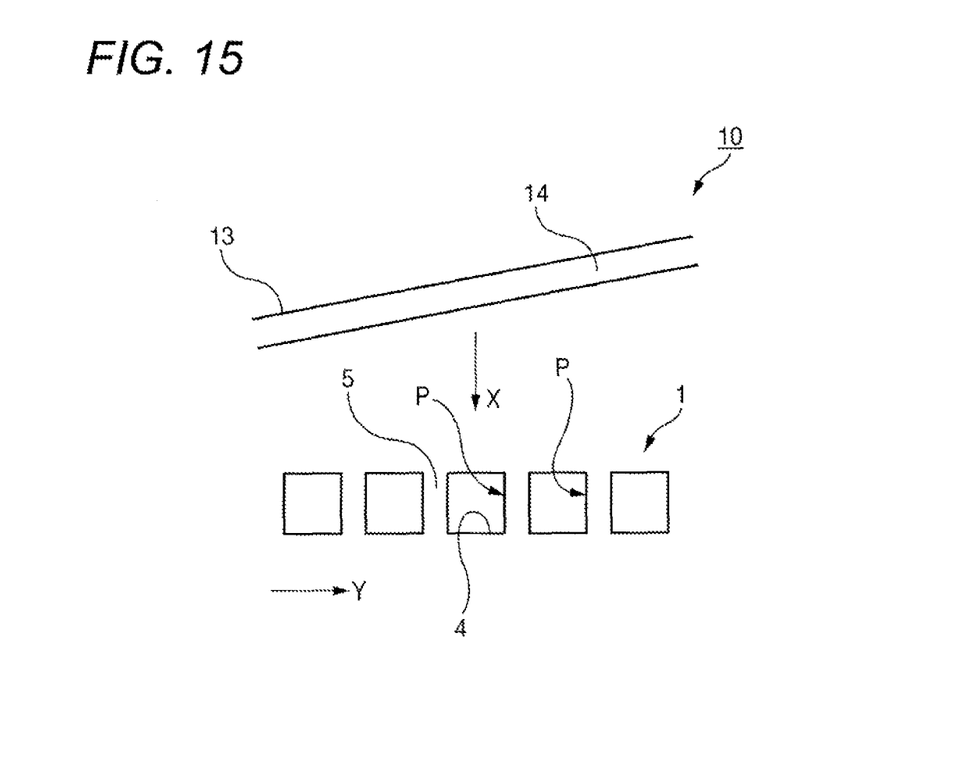
FIG. 15 is a plan view of another modified example of the metal mask of FIG. 5.

As illustrated in FIG. 15, in another modified example of the metal mask 1, the respective opening portions 4 each having a square are disposed along the longitudinal direction of the formed circuit patterns. In this modified example, the longitudinal direction of the squeegees 14 is disposed relatively along the direction intersecting with a direction orthogonal to the alignment direction of the opening portions 4 and the bridge portions 5 in the metal mask 1 at a given angle, and the squeegees 14 travel relatively along the X-direction orthogonal to the alignment direction of the opening portions 4 and the bridge portions 5 in the metal mask 1. As a result, with the travel of the squeegees 14 in the X-direction, the paste P is pressed and advanced from each opening portion 4 toward each lower side of the bridge portions 5 with the result that the respective opening portions 4 including the lower sides of the bridge portions 5 are sufficiently filled with the paste P.

As described above, in the screen printing device 10 employing the electrode formation system for a solar cell according to the embodiment of the present invention, in the screen printing process, the squeegees 14, which are arranged relatively to the metal mask 1 so that the longitudinal direction thereof conforms with the direction orthogonal to the alignment direction of the opening portions 4 and the bridge portions 5 of the metal mask 1, travel relatively to the metal mask 1 along the alignment direction of the opening portions 4 and the bridge portions 5 in the metal mask 1. Then, in the baking process, a paste on the surface of the base member 11 is baked.

Accordingly, in the screen printing device 10 employing the electrode formation system for a solar cell according to the embodiment of the present invention, with the use of the squeegee head 13 of the cartridge type in the screen printing process, the thick electrode is formed through one screen printing process and one baking process with the result that the productivity can be improved.

In the screen printing device 10 employing the electrode formation system for a solar cell according to the embodiment of the present invention, with the use of the squeegee head 13 of the cartridge type in the screen printing process, since each of the printing process and the baking process is conducted only once, the man-hour can be remarkably reduced.

In the screen printing device 10 employing the electrode formation system for a solar cell according to the embodiment of the present invention, the aspect ratio of a mesh mask use up to now is 0.7 or lower whereas the aspect ratio can be dramatically improved with the use of the squeegee head 13 of the cartridge type in the screen printing process.

In the screen printing device 10 employing the electrode formation system for a solar cell according to the embodiment of the present invention, because the paste can be efficiently supplied to the opening portions 4 and the bridge portions 5 in the metal mask 1, the electrode of the solar cell can be surely formed in a desired configuration.

In the screen printing method employing the electrode formation method for a solar cell according to the embodiment of the present invention, the screen printing process is conducted in which the squeegees 14, which are arranged relatively to the metal mask 1 so that the longitudinal direction thereof conforms with the direction orthogonal to the alignment direction of the opening portions 4 and the bridge portions 5 of the metal mask 1, travel relatively to the metal mask 1 along the alignment direction of the opening portions 4 and the bridge portions 5 in the metal mask 1. Then, in the subsequent baking process, the paste on the surface of the base member 11 is baked.

Accordingly, in the screen printing method employing the electrode formation method for a solar cell according to the embodiment of the present invention, with the use of the squeegee head 13 of the cartridge type in the screen printing process, the thick electrode is formed through one screen printing process and one baking process with the result that the productivity can be improved.

EXAMPLE

Subsequently, a description will be given of an example that is conducted for the purpose of confirming the actions and advantages of the screen printing device 10 applying the electrode formation system for a solar cell and the screen printing method applying the electrode formation method for a solar cell according to the present invention. In this example, a comparative example 1 in which with the use of the mesh mask having an aperture ratio of 50% or lower, gap printing is conducted by the squeegee head of the open type, and a comparative example 2 in which with the use of the mesh mask having an aperture ratio of 50% or lower, contact printing is conducted by the squeegee head of the cartridge type, are prepared to form the electrode for a solar cell. Then, the aspect ratio of the height dimension of the formed electrode and the width dimension of the electrode in the section area is measured.

As a result of the example, the comparative example 1 is 0.3 or lower in the aspect ratio, and the comparative example 2 is 0.7 or lower in the aspect ratio. On the contrary, the aspect ratio according to the present invention is 1.0 or higher. It is found that this is because the squeegees 14 of the squeegee head 13 of the cartridge type, which are arranged relatively to the metal mask 1 so that the longitudinal direction thereof conforms with the direction orthogonal to the alignment direction of the opening portions 4 and the bridge portions 5 of the metal mask 1, travel relatively to the metal mask 1 along the alignment direction of the opening portions 4 and the bridge portions 5 in the metal mask 1. With this configuration, the metal mask 1 having the aperture ratio of 90% or higher is applicable.

The support 12, the squeegees 14, and the cleaning mechanism 15 used in the above embodiment are not limited to the above exemplification, but can be appropriately changed.

The present application is based on Japanese Patent Application No. 2010-068256 filed on Mar. 24, 2010, and content thereof is incorporated herein by reference.

DESCRIPTION OF REFERENCE SIGNS

1: Metal Mask
3: Covering Portion
4: Opening Portion
5: Bridge Portion
10: Screen Printing Device (Electrode Formation System for Solar Cell)
11: Base Member
13: Squeegee Head
14: Squeegee
P: Paste

The invention claimed is:

1. An electrode formation system for a solar cell to form an electrode of a base member used for the solar cell, said electrode formation system comprising:
a screen printing unit comprising:
a metal mask comprising a covering portion configured to cover a part of a surface of the base member, a plurality of opening portions configured to allow parts of the base member to be exposed therefrom, and bridge portions disposed along a direction intersecting with a longitudinal direction of circuit patterns between the opening portions; and
a squeegee head of a cartridge type which comprises a squeegee, and which is configured to supply a paste for forming the electrode to an upper surface of the metal mask under a given pressure after the metal mask is mounted on the surface of the base member, while the squeegee having a given length is relatively slid on the upper surface of the metal mask,
wherein a lower surface of each of the bridge portions is formed into a recess step surface with respect to a lower surface of the covering portion, and
wherein in the screen printing process, the squeegee of the squeegee head of the cartridge type is disposed such that a longitudinal direction of the squeegee conforms with a direction intersecting with a direction orthogonal to an alignment direction of the opening portions and the bridge portions at a given angle, and the squeegee travels relatively to the metal mask along the direction orthogonal to the alignment direction of the opening portions and the bridge portions, whereby the opening portions including lower sides of the bridge portions are filled with the paste.

2. The electrode formation system for a solar cell according to claim 1,
wherein the squeegee head is disposed relatively to the metal mask such that the longitudinal direction of the squeegee extends along the direction orthogonal to the alignment direction of the opening portions and the bridge portions, and
wherein the squeegee travels relatively to the metal mask along the alignment direction of the opening portions and the bridge portions.

3. The electrode formation system for a solar cell according to claim 1,
wherein the electrode is formed by conducting the screen printing process once.

4. The electrode formation system for a solar cell according to claim 3,
wherein an aspect ratio for a cross-sectional shape of the electrode is 1.0 or higher.

5. An electrode formation method for a solar cell to form an electrode of a base member used for the solar cell, said electrode formation method comprising:
a screen printing process comprising:
mounting a metal mask on a surface of the base member, wherein the metal mask comprises a covering portion configured to cover a part of a surface of the base member, a plurality of opening portions configured to allow parts of the base member to be exposed therefrom, and bridge portions disposed along a direction intersecting with a longitudinal direction of circuit patterns between the opening portions, a lower surface of each of the bridge portions being formed into a recess step surface with respect to a lower surface of the covering portion; and
supplying a paste for forming the electrode to an upper surface of the metal mask under a given pressure by a squeegee head of a cartridge type, while relatively sliding a squeegee having a given length on the upper surface of the metal mask such that the squeegee of the squeegee head of the cartridge type is disposed such that a longitudinal direction of the squeegee conforms with a direction intersecting with a direction orthogonal to an alignment direction of the opening portions and the bridge portions at a given angle, and the squeegee travels relatively to the metal mask along the direction orthogonal to the alignment direction of the opening portions and the bridge portions, whereby the opening portions including lower sides of the bridge portions are filled with the paste.

6. The electrode formation method for a solar cell according to claim 5,
wherein after the squeegee is disposed relatively to the metal mask such that the longitudinal direction of the squeegee extends along the direction orthogonal to the alignment direction of the opening portions and the bridge portions, the squeegee travels relatively to the metal mask along the alignment direction of the opening portions and the bridge portions.

7. The electrode formation method for a solar cell according to claim 5,
wherein the electrode is formed by conducting the screen printing process once.

* * * * *